(12) United States Patent
Marzynski et al.

(10) Patent No.: US 9,651,606 B2
(45) Date of Patent: May 16, 2017

(54) FLUORESCENT LAMP TESTING DEVICE

(71) Applicant: Fluke Corporation, Everett, WA (US)

(72) Inventors: Matthew B. Marzynski, Seattle, WA (US); Ricardo Rodriguez, Mill Creek, WA (US)

(73) Assignee: Fluke Corporation, Everett, WA (US)

( * ) Notice: Subject to any disclaimer, the term of this patent is extended or adjusted under 35 U.S.C. 154(b) by 225 days.

(21) Appl. No.: 14/306,094

(22) Filed: Jun. 16, 2014

(65) Prior Publication Data

US 2015/0362545 A1    Dec. 17, 2015

(51) Int. Cl.
*G01R 31/24* (2006.01)
*G01R 31/44* (2006.01)

(52) U.S. Cl.
CPC ............ *G01R 31/245* (2013.01); *G01R 31/44* (2013.01)

(58) Field of Classification Search
CPC ......... G01R 31/24; G01R 31/44; G01R 31/08
USPC ..... 324/99 D, 114, 115, 156, 149, 403, 414, 324/555, 556, 713; 315/129; 356/237.1, 356/432
See application file for complete search history.

(56) References Cited

U.S. PATENT DOCUMENTS

| | | | |
|---|---|---|---|
| 4,081,678 A | 3/1978 | Macall | |
| 4,142,801 A | 3/1979 | Calder et al. | |
| 5,296,815 A * | 3/1994 | Conway | G01R 31/245 324/133 |
| 5,836,694 A | 11/1998 | Nguyen | |
| 6,087,834 A * | 7/2000 | Tury | G01R 31/44 324/414 |
| 6,154,182 A * | 11/2000 | McLean | H01Q 9/28 343/752 |
| 6,445,142 B1 | 9/2002 | Xia et al. | |
| 2002/0084784 A1 | 7/2002 | Cook et al. | |
| 2006/0007047 A1* | 1/2006 | Dawson | H01Q 1/244 343/702 |
| 2006/0010761 A1 | 1/2006 | Staley, III | |

(Continued)

FOREIGN PATENT DOCUMENTS

EP        2 405 280 A2      1/2010

OTHER PUBLICATIONS

Extended European Search Report mailed Nov. 23, 2015, for corresponding EP Application No. 15172265.9-1560, 8 pages.

(Continued)

*Primary Examiner* — Tung X Nguyen
*Assistant Examiner* — Robert P Alejnikov, Jr.
(74) *Attorney, Agent, or Firm* — Seed IP Law Group LLP

(57) ABSTRACT

A fluorescent lamp testing device 10 has a microcontroller 100 that controls tests for ballast discrimination as well as gas integrity, ballast operation, filament continuity and line voltage. The ballast discrimination test is performed by the microcontroller 100 in combination with a photodiode 30 and high/low pass filter 32. Gas integrity is tested with pulse width modulation and a high-voltage, step-up transformer (PWM/T) circuit 42 and an antenna 40. A built in continuity tester has input pins 52, 54 to test the continuity of the filaments in the fluorescent lamp 12. The antenna 40 and a voltage-divider/voltage-sensor connected to the secondary coil in the transformer test for ballast operation. A PCB conductive loop 18, rectifier 20 and op amp 22 test for line voltage.

22 Claims, 3 Drawing Sheets

(56) References Cited

U.S. PATENT DOCUMENTS

| | | | |
|---|---|---|---|
| 2009/0216910 A1* | 8/2009 | Duchesneau | G06F 9/5072 709/250 |
| 2010/0126071 A1* | 5/2010 | Hill | E06B 7/32 49/70 |
| 2010/0324830 A1* | 12/2010 | Solie | G01N 21/55 702/19 |
| 2012/0007602 A1* | 1/2012 | Morrow | G01R 31/24 324/414 |
| 2012/0159833 A1 | 6/2012 | Hakanson et al. | |
| 2014/0026464 A1 | 1/2014 | Wiklund | |
| 2014/0115977 A1* | 5/2014 | Egan | E04H 12/345 52/116 |

OTHER PUBLICATIONS

European Search Report dated Jul. 20, 2015 for corresponding European Application No. 15155086.0-1562, 8 pages.

Advance, "Advance Ballast Checker," ABC100, 2008, retrieved from https://www.kirbyrisk.com/woeb/datasheets/ABTFRME00180_1.pdf, 1 page.

Amprobe, "Amprobe LT-10 Lamp Tester," 2013, retrieved from http://content.amprobe.com/distributors/LT-10/4266278B_LT-10_END-USER_FLYER_w.pdf, 1 page.

Amprobe, "LT-10 Lamp Tester," 2013, retrieved from http://content.amprobe.com/DataSheets/LT-10%20Lamp%20Tester.pdf , 2 pages.

"Experiment Electronic Ballast—Electronic Ballast for Fluorescent Lamps," Revised Sep. 18, 2012, retrieved from http://www.ece.vt.edu/ece3354/labs/ballast.pdf, 20 pages.

"Lighting and Ballast Demo—Lab Review Sheet," Revised Spring 2010, retrieved from http://www.ece.vt.edu/ece3354/labs/Ballast_review.pdf, 3 pages.

Lighting Controls Association, "Advance Offers Exclusive New "Ballast Checker" Tool to Support Lighting Audits and Upgrades," Sep. 17, 2006, retrieved from http://lightingcontrolsassociation.org/advance-offers-exclusive-new-ballast-checker-tool-to-support-lighting-audits-and-upgrades/, 2 pages.

* cited by examiner

FLUORESCENT LAMP TESTING DEVICE

BACKGROUND

Fluorescent lamps are ubiquitous in industrial, commercial, and residential establishments. Studies indicate that fluorescent lamps more efficiently generate light than incandescent lamps. Recent changes in federal laws that mandate improved efficiency of all lamps will likely result in higher production and use of fluorescent lamps. However, fluorescent lamps have certain disadvantages. Other studies indicate that fluorescent lamps with low frequency magnetic ballasts generate flicker, which may induce migraine headaches. Such lamps may also establish a beat frequency with computer displays that can also trigger migraines. Conventional magnetic ballasts may be insulated with PCB materials that are poisonous to humans. Because of the foregoing potential and actual health hazards of fluorescent lamps with magnetic ballasts, regulatory entities now limit fluorescent fixtures with magnetic ballasts to outdoor use only. It is either mandated or common practice to replace older indoor magnetic ballasts with electronic ballasts.

Electronic ballasts do not use any PCBs. Instead they use solid-state electronics to generate high frequency kilohertz pulses that are beyond the range of human perceptions. As such, fluorescent lamps with electronic ballasts are considered safer for individuals who suffer from migraines and include no poisonous insulating materials such as PCBs.

Fluorescent lighting fixtures are more complex than incandescent lighting fixtures and there are a number of reasons why a fluorescent light bulb may fail. In some cases, the gas inside the fluorescent tube leaks out and the fluorescent lamp cannot conduct current to provide light. It is also possible that the filaments used to excite the gas within the fluorescent tube may be burned out or otherwise disabled. Other problems include broken portions of the lighting fixture such as the so-called "tombstone" connectors that receive the pins of an elongated fluorescent bulb. In addition, every fluorescent bulb has some kind of ballast, and the ballast may have failed. Another source of breakdown is an open circuit in the line voltage leading to the ballast.

Conventional fluorescent testing equipment can perform a number of tests to diagnose the problem(s) that may cause a fluorescent light to fail. Such test equipment can test the integrity of the gas in a fluorescent tube, examine the continuity of the filaments, check the operation of the ballast, and sense noncontact line voltage. Some conventional test equipment uses a handheld instrument with a rotary control knob that mechanically switches the instrument from one test to another. The conventional test equipment includes a noncontact voltage sensor to detect line voltage and an ohmmeter to test continuity of the filaments of the fluorescent tube. Such test equipment uses an antenna that is connected to the test equipment to receive a gas excitation voltage. Holding the antenna proximate the lamp will temporarily turn the lamp on if there is gas in the lamp. Some equipment provides the antenna as a separate element and other equipment fixes the antenna to the body of the test equipment. The antenna has a collapsible mast that terminates in a top hat extends beyond the edge of the body of the equipment. The top hat of the antenna is unprotected against potential damage. The antenna may also be placed in a receive mode to test whether the ballast is generating an output voltage.

However, conventional test equipment cannot discriminate between magnetic and electronic ballasts. Instead there is distinct and separate equipment to determine whether or not the lighting fixtures conform to jurisdictional laws and regulations that prohibit indoor use of fluorescent lighting fixtures with magnetic ballasts. However, such discriminator devices do not provide any other electrical testing for the fluorescent lamp and lighting fixture.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

The embodiments disclosed herein overcome individual problems of the prior art test equipment and discriminators by providing a comprehensive device that not only performs all electrical tests for fluorescent tubes, but also discriminates between fluorescent lighting fixtures having magnetic ballasts and those having electronic ballasts. The embodiments provide in a single device all of the tests 5 that would be required for fluorescent lighting fixtures regardless of the purpose of the tests, i.e., electrical testing or legal compliance. The embodiments also provide protection for the portion of the antenna shaped as a top hat to prevent damage during ordinary use.

An embodiment of the fluorescent lamp testing device has a rectangular body with two relatively short ends opposite each other. A collapsible antenna is disposed at one short end. The top hat portion (or top hat) is centered on the short end and collapses to or below the walls at the short end to protect the antenna from damage. At the other short end, there is a pair of pin terminals for testing the continuity of the filaments in a fluorescent tube. The rectangular body has an elongated surface disposed between the opposing short ends of the body. Below the surface there is operational circuitry for carrying out the electrical testing and ballast discrimination. Control buttons on the control panel are coupled to the operational circuitry and enable the user to perform ballast discrimination and other electrical tests. The ballast discrimination control button has two indicators closely associated with it that emit a recognizable signal to discriminate between magnetic and electronic ballasts. A third indicator, a large light-emitting diode (LED), is disposed proximate the short end of the device near the pin terminals. The LED is a two-color device and provides adequate information on the gas integrity, ballast operation, and noncontact voltage.

In some embodiments, the antenna has a collapsible mast and terminates in the top hat. The collapsible mast passes through an annular opening at one end of the device. The annular opening is defined by opposing two pairs of opposing walls that are transverse to each other. The top hat of the antenna rests on the wall that is distal from the body.

Embodiments include a microcontroller that has a small memory and a clock and controls operations of the circuitry for testing fluorescent lamps. The circuitry includes a pulse width modulator and transformer that generate a high voltage at a high frequency. The high frequency voltage may be capacitively coupled into the lamp via the antenna in order to test the gas integrity of the fluorescent lamp. The circuitry also includes a photodiode for discriminating between magnetic and electronic ballasts. The photodiode receives light from the fluorescent lamp and modulates current that varies at the frequency of the ballast. The modulated current of the photodiode is converted to a voltage and applied to a filter that passes either low or high frequency signals. If the lamp has a magnetic ballast, the voltage will have a relatively low frequency such as 60 hertz and will pass through the low pass filter to activate a first indicator light. If the lamp has electronic ballast, the voltage will have a relatively high frequency in the range of kilohertz. It will pass through the high pass filter to activate a second indicator light.

The antenna can also be used as a receiver to test the operation of a ballast. The antenna is capable of coupling electromagnetic energy generated by the ballast into a voltage divider attached to the secondary of the transformer. The voltage divider and an op amp circuit couple the antenna output to the microcontroller. By sensing whether or not there is electromagnetic energy detected at the output if the ballast, the device confirms the operation of the ballast.

The device tests the continuity of a filament between the pins of a fluorescent lamp. A lamp has a pair of pins at each end and a filament between each pair of pins. The filament has a very low resistance and generates enough potential voltage across the fluorescent tube to excite the gas within the fluorescent lamp, thereby generating a current through the gas. The body of the device has a pair of pin terminals that receive the pins of the lamp. A low continuity indicates the filament is operational and a high continuity indicates the filament is broken, or "open."

The testing device also includes a noncontact voltage detector that includes a PCB conductive loop for sensing AC line voltage. The PCB conductive loop detects electromagnetic energy and is in series with a rectifier and an op amp that is input to the microcontroller for determining whether or not any AC line voltage is present.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Figure 1:
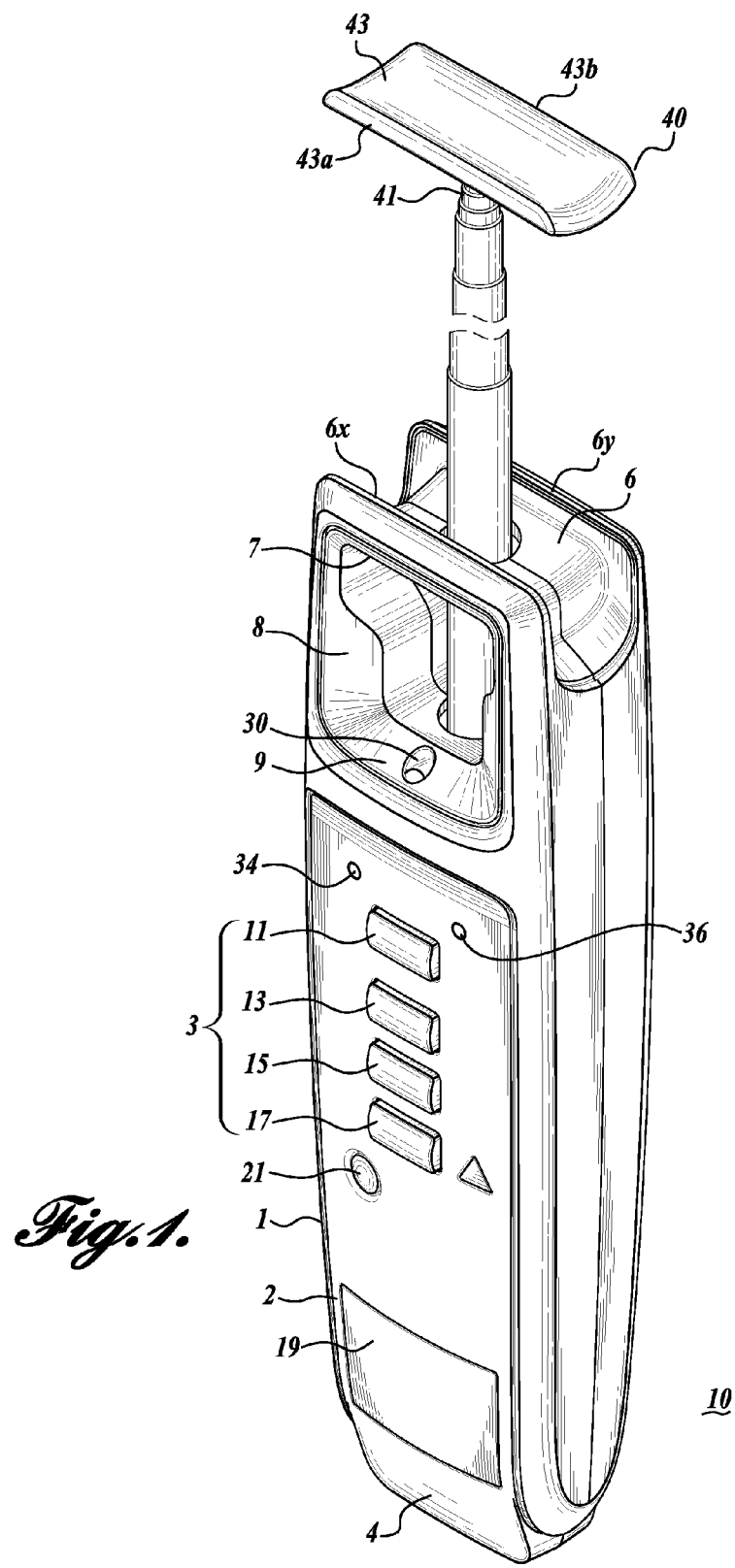
FIG. 1 is a perspective view of a fluorescent lamp testing device.
Figure 2:
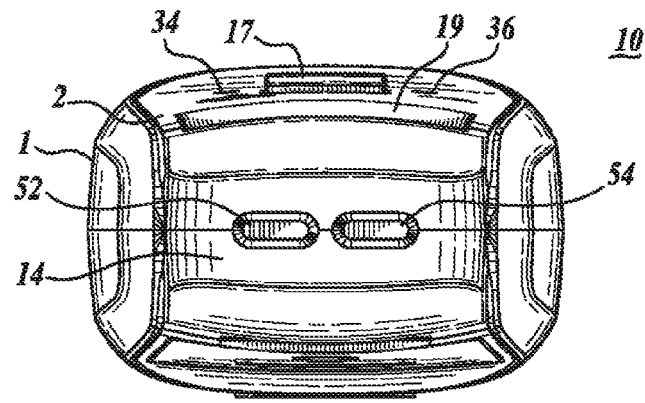
FIG. 2 is an end view of the device of FIG. 1.

Turning to FIG. 1, there is shown a device 10 for testing fluorescent lamps and lighting fixtures. The device has an elongated rectangular body 1 with two relatively short ends 4, 6 opposite each other. The rectangular body has an elongated surface 2 disposed between the opposing short ends 4, 6 of the body 1. The elongated surface 2 includes a control panel 3. The control panel 3 includes a number of operator input buttons: button 21 turns the device 10 on or off, button 11 initiates a test for discriminating the ballast type, button 13 initiates a test for gas integrity, button 15 initiates a test to determine the operability of the ballast in the fluorescent lighting fixture, and button 17 initiates a non-contact voltage test to determine whether or not AC line voltage is available to the lighting fixture. Indicator lights 34, 36 indicate whether a ballast is a magnetic or electronic ballast, respectively. Pin receiver terminals 52, 54 are on the short end 4 of the body 1 for testing filament conductivity. See FIGS. 2 and 4.

An antenna 40 has a collapsible mast 41 with a portion shaped as a top hat 43 on the end of the mast. The mast 41 and top hat 43 are centered on and extend from the short end 6. The mast 41 collapses to or below the walls 6x, 6y to protect the long edges of the top hat from damage when not in use. When the mast 41 is fully collapsed, edges 43a, 43b of the top hat may be overlapped by edges in whole or in part by edges of the walls 6x, 6y of the end 6.

Figure 3:
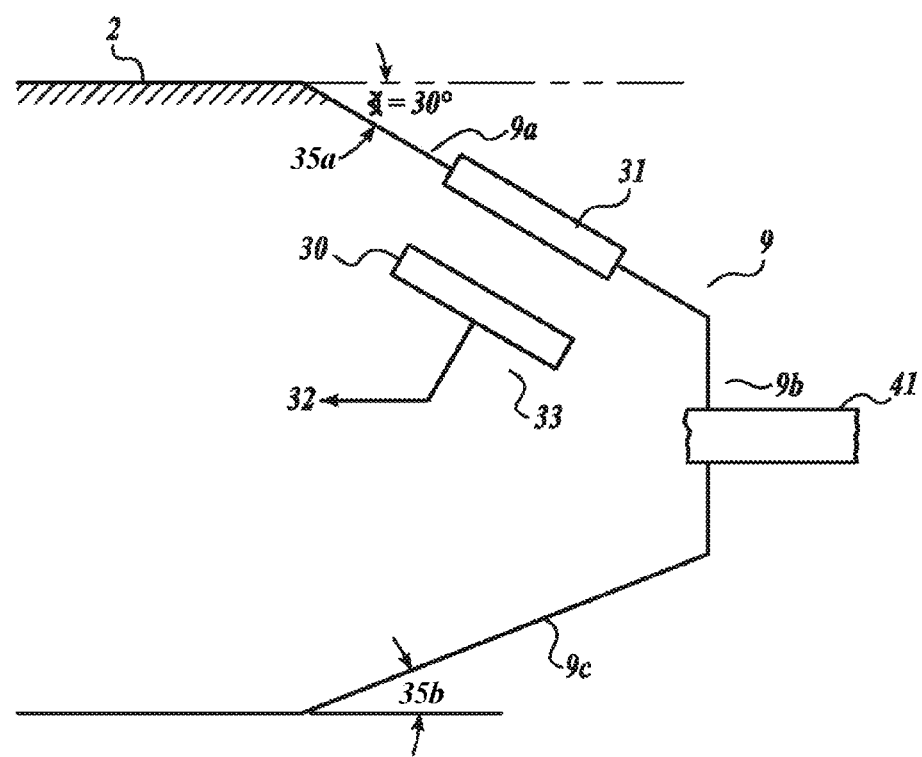
FIG. 3 shows the relative position of the photodiode in the testing device of FIG. 1.

The lower portion of the mast 41 passes through an annular opening 8 defined by a wall 9 that has a trapezoidal shape with three surface portions, 9a, 9b, 9c. See FIG. 3. Lens 31 is disposed on the surface portion 9a that is inclined at an angle 35a of approximately 30 degrees. The surface portion 9b is flat or transverse to the control surface 2. The remaining surface portion 9c is inclined at an angle 35b with respect to the surface opposite control surface 2. The photodiode 30 is located below the lens 31. Both the lens 31 and the photodiode 30 are inclined at an angle to the control surface 2, preferably at angle 35a.

Figure 4:
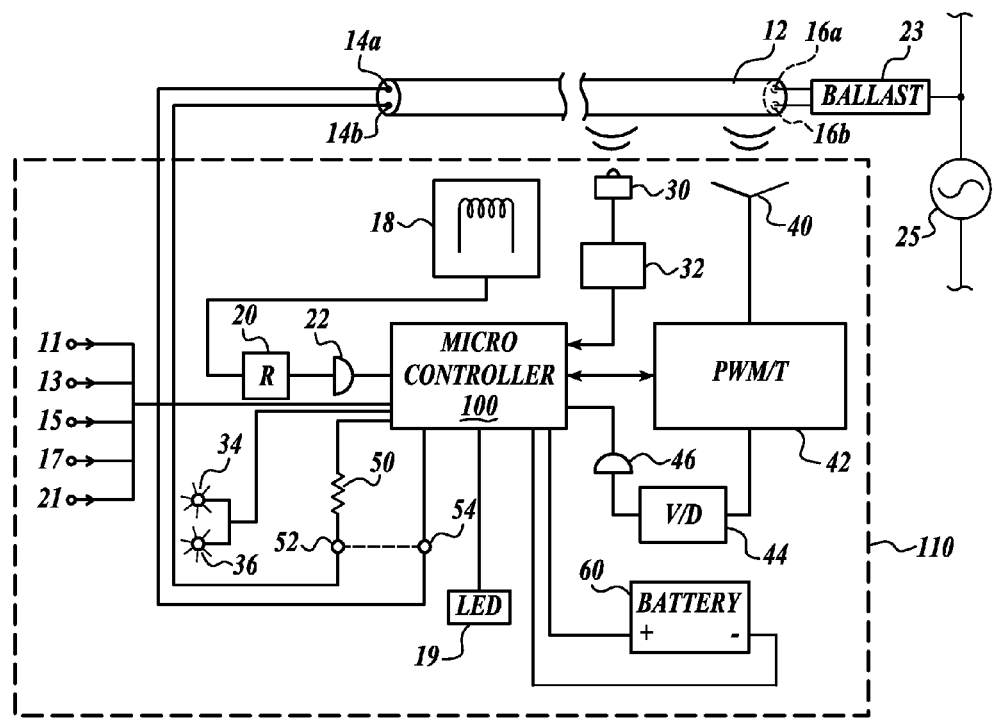
FIG. 4 is a schematic view of the control circuitry of the testing device of FIG. 1.

Turning to FIG. 4, there is shown a fluorescent lamp 12 with connection pins 14a, 14b and 16a, 16b on opposite ends, a ballast 23 and a source of AC line voltage 25. The ballast 23 may be a magnetic or electronic ballast. A magnetic ballast has a current limiting inductor designed to operate at line voltage or approximately 60 hertz. An electronic ballast has a high frequency pulse width modulation circuit and a high-voltage transformer. A high frequency pulse is applied to a primary coil of a transformer. The secondary of the ballast is coupled to the pins. The transformer in the ballast raises the applied voltage and regulates the current to the filaments disposed between the pins 14a, 14b and 16a, 16b. The electronic ballast operates in the range of approximately 20 to 40 kilohertz.

The control circuitry 110 of device 10 includes a microcontroller 100, operator input buttons 11, 13, 15, 17, 21, and other components. The microcontroller 100 receives inputs from the control buttons and from other components and provides outputs to indicator lights 34, 36 and LED 19. Battery 60 supplies power for the microcontroller and the other components. The microcontroller 100 either connects or controls power from the battery 60 to the components in the circuitry 110. The microcontroller 100 receives the output signals from one or more components and interprets the signals in accordance with predetermined logic embedded or programmed into the microcontroller in a manner well known to those skilled in the art. Programming stored in the microcontroller temporarily interconnects selected components to form test circuits for discriminating between ballasts and testing for gas integrity, ballast operation, pin conductivity and line voltage.

A ballast discriminator test circuit includes test button 11, photodiode 30 and a low pass/high pass filter 32, microcontroller 100, and LEDs 34, 35. Lens 31 passes light from the lamp 12 onto the photodiode 30. Pressing test button 11 enables the microcontroller to receive input signals from the photodiode 30. The photodiode 30 converts light into a current that is applied to the low pass/high pass filter 32. The output 30 frequency of the photodiode current will be the same as the frequency of output voltage of the ballast 23. If the light was produced with a magnetic ballast, the frequency of the output current of the photodiode 30 will be a low frequency that is nominally 60 Hz but may range between 50-70 Hz. If the light was produced with an electronic ballast, the output frequency will be a high frequency, nominally tens of kilohertz. Microcontroller 100 receives the digital signal from the low pass/high pass filter 32 and turns on LED 34 if the frequency detected is low (magnetic) or LED 36 (electronic) if the frequency detected is high.

Assuming that the fluorescent lamp 12 is operational and emitting light, a test may be conducted to determine whether or not the ballast 23 is a magnetic or electronic ballast. The user holds the body of the device 10 to expose the photodiode 30 to light from the lamp 12. By angling the surface 9a and providing the lens 31 and photodiode transverse to the angled surface, the user conveniently collects light at the photodiode. If the mercury vapor is excited by a low frequency, magnetic ballast, then indicator "magnetic" LED 34 will turn on. If the ballast 23 is an electronic ballast, then "electronic" indicator 36 will turn on.

If the lamp 12 is not lit, a technician will perform a gas integrity test. The gas integrity test couples high frequency, high voltage electro-magnetic energy to the lamp 12 to excite gas inside the lamp 12. If there is gas in the lamp it will light; otherwise it will not. The gas integrity test circuit uses test button 13, microcontroller 100, a PWM/T circuit 42 and antenna 40. In the PWM/T 42 there is a pulse width modulation (PWM) circuit and a step up transformer with primary and secondary coils. The PWM/T 42 is the functional equivalent of an electronic ballast. Pressing test button 13 connects a high frequency clock signal from the microcontroller to control terminals of power transistors in the PWM. The power transistors are connected to the battery and are switched by the microcontroller clock signal to generate a high frequency, low voltage signal in the primary coil of the transformer in PWM/T 42. The secondary coil outputs a high voltage, high frequency signal. The antenna 40 capacitively couples the high voltage, high frequency signal to the lamp 12. If there is sufficient gas in the lamp 12 it will light.

If the lamp passes the gas integrity test but does not light, the technician will perform a ballast test. The ballast test senses whether ballast 23 generates a voltage output. The ballast test circuit includes test button 15, microcontroller 100, antenna 40, the secondary coil in PWM/T 42, voltage divider 44, and op amp 46. Upon pressing button 15, the antenna 40 is placed in a received mode. The antenna 40 is disposed proximate the ballast 23. If ballast 23 is operating it will generate an electromagnetic filed and antenna 40 will capacitively couple the field to the voltage-divider connected to the secondary of the coil in the PWM/T 42. Voltage divider 44 receives the output of the secondary coil and the divider output is connected via op amp 46 to microcontroller 100. If the ballast is operating, the antenna detects an electromagnetic field above a predetermined threshold and LED 19 glows green.

If the ballast is operational but the lamp still does not light, the user will test the continuity of the filaments in the lamp and inspect the connectors in the lighting fixture. Pin receiver terminals 52, 54 provide inputs to a continuity test circuit to determine whether or not filaments disposed between pins 14a, 14b and 16a, 16b are functional. In FIG. 4, the dash line between terminals 52 and 54 indicates a filament. A large resistor 50 is in series with terminal 52. If the filament is intact, then the voltage drop between pin terminals 52 and 54 will be relatively low. On the other hand, if the filament is broken, the voltage drop will be relatively high. To perform the test, a technician inserts pins 14a, 14b or 16a, 16b into the pin receptacles 52, 54. If the filaments between the pins are intact, the LED will glow green. If a filament is broken or otherwise inoperative, the LED 19 will glow red.

While the lamp is out of the lighting fixture, the technician will inspect the so-called "tombstone" connectors in the fixture. Those are the connectors that receive the pins and hold the lamp in the fixture. If those connectors are damaged, they may be the cause of the problem.

If the foregoing tests are still inconclusive, the technician conducts a final test to confirm there is line voltage to the fixture. To test for line voltage, the end 4 of the body 1 of the testing device is held proximate to the electrical conductor supplying current to the ballast 23. Below the surface 2 of the body, a PCB conductive loop 18 is provided to detect line voltage. A noncontact voltage test is performed using test button 17, PCB conductive loop 18, a rectifier 20, an op amp 22, and microcontroller 100. The PCB conductive loop 18 will sense electrical energy emitted by the line voltage 25. Any detected energy will be rectified and amplified and fed to the microcontroller 102. If line voltage is present, the LED 19 will glow red indicating that there is AC power to the ballast and thereby warning the user to be cautious. If there is no AC current to the ballast, LED 19 will glow green.

While illustrative embodiments have been illustrated and described, it will be appreciated that various changes can be made therein without departing from the spirit and scope of the invention.

The embodiments of the invention in which an exclusive property or privilege is claimed are defined as follows:

1. An apparatus for testing fluorescent lamps and lighting fixtures comprising:
   an elongated body having two relatively short ends opposite each other, two relatively long ends opposite each other and transverse to the short ends, and an annular opening at one of the short ends, the annular opening defined between two walls transverse to a length of the elongated body and two walls parallel to the length of the elongated body;
   an elongated surface disposed between opposing ends of the body;
   operational circuitry disposed below the elongated surface of the body;
   a control panel on the elongated surface of the body;
   control buttons on the control panel and coupled to the operational circuitry for operating the apparatus to conduct tests, wherein the operational circuitry tests for ballast type, gas integrity, ballast operation and non-contact voltage, and filament continuity, and wherein in the ballast type test, the operational circuitry discriminates between magnetic ballasts and electronic ballasts;
   one or more indicators on the elongated surface for displaying results of one or more tests conducted by the apparatus; and
   an antenna that is disposed at an end of the elongated body, wherein the antenna has a collapsible mast oriented parallel to the length of the elongated body and a top hat having long edges disposed transverse to the collapsible mast, and wherein the mast collapses to or below walls of the apparatus to protect the long edges of the top hat from damage when not in use, the edges of the top hat being overlapped in whole or in part by edges of the walls.

2. The apparatus of claim 1 wherein the antenna is disposed at one short end and a pair of filament input terminals is disposed at the opposite short end.

3. The apparatus of claim 1 wherein the one or more indicators comprise:
   first and second indicators on the elongated surface for displaying results of the ballast type test; and a third indicator on the elongated surface of the body for displaying results of other tests.

4. The apparatus of claim 3 wherein the first and second indicators display whether the ballast is a magnetic ballast or an electronic ballast.

5. The apparatus of claim 1 further comprising a photodiode disposed on the body for receiving light from a fluorescent lamp.

6. The apparatus of claim 5 wherein the photodiode is covered by a lens for focusing light onto the photodiode.

7. The apparatus of claim 5 wherein the photodiode is recessed with respect to the elongated surface of the apparatus.

8. The apparatus of claim 7 wherein the photodiode is disposed at angle with respect to the elongated surface.

9. The apparatus of claim 8 wherein the angle is an acute angle.

10. The apparatus of claim 9 wherein the angle is approximately 30 degrees.

11. The apparatus of claim 5 wherein the photodiode is coupled to a high-pass and a low-pass filter.

12. The apparatus of claim 11 wherein one of the indicators activates when the high-pass filter passes a high frequency signal and another indicator activates when the low-pass filter passes a low frequency signal.

13. The apparatus of claim 12 wherein the low-pass filter passes signals between 50-70 Hz and the high-pass filter passes signals in a range of tens of kilohertz.

14. The apparatus of claim 1 wherein the two walls transverse to the length of the elongated body includes a first wall proximate the elongated surface and an opposite second wall distal from the elongated surface, wherein the collapsible mast extends from the first wall through the opposite second wall, wherein the second, distal wall limits travel of the top hat of the antenna toward the elongated surface and a portion of the second, distal wall limits lateral displacement of the collapsible mast.

15. The apparatus of claim 14 wherein edges of the second wall transverse to the body at least partially overlap edges of the top hat.

16. The apparatus of claim 1 wherein the operational circuitry comprises a microcontroller, a battery, a pulse width modulator, and a transformer for generating a ballast type test voltage signal at a frequency of tens of kilohertz.

17. The apparatus of claim 16 wherein an output of the transformer is connected to the antenna.

18. An apparatus for testing fluorescent lamps and lighting fixtures comprising:
a elongated body having two relatively short ends opposite each other, two relatively long ends opposite each other and transverse to the short ends, and an annular opening at one of the short ends, the annular opening defined by two walls transverse to a length of the elongated body and two walls parallel to the length of the elongated body;
operational circuitry disposed within the elongated body;
a control panel on the elongated body having controls communicatively coupled to the operational circuitry for operating the apparatus to conduct tests; and
an antenna that extends from an end of the elongated body, wherein the antenna has a collapsible mast that passes through the annular opening and terminates in a top hat having a surface and long edges disposed transverse to the collapsible mast, wherein the top hat is used to test fluorescent lamps and lighting fixtures, and wherein the mast collapses to or below walls of the apparatus to protect the long edges of the top hat from damage when not in use, the edges of the top hat being overlapped in whole or in part by edges of the walls.

19. The apparatus of claim 18 further comprising a photodiode disposed at an angle on the elongated body, wherein the photodiode receives light from a fluorescent lamp and is coupled to circuitry disposed within the elongated body that discriminates between magnetic and electronic ballasts.

20. The apparatus of claim 19 wherein the photodiode is disposed along a circumference of the annular opening.

21. The apparatus of claim 18 wherein the collapsible mast extends from a first wall of the two walls transverse to the length of the elongated body through a second wall of the two walls transverse to the length of the elongated body, wherein the second wall is distal from the first wall, and wherein the second wall limits travel of the top hat of the antenna toward the elongated body when the collapsible mast of the antenna is retracted.

22. The apparatus of claim 21 wherein a portion of the second wall transverse to the length of the elongated body limits lateral displacement of the collapsible mast, and when the collapsible mast is retracted, the surface of the top hat is seated entirely at or below edges of the second wall.

* * * * *